United States Patent
Chen et al.

(10) Patent No.: US 9,960,349 B2
(45) Date of Patent: May 1, 2018

(54) RESISTIVE RANDOM-ACCESS MEMORY STRUCTURE AND METHOD FOR FABRICATING THE SAME

(71) Applicant: Winbond Electronics Corp., Taichung (TW)

(72) Inventors: Yi-Hsiu Chen, Zhubei (TW); Ming-Hung Hsieh, Yilan (TW); Po-Yen Hsu, New Taipei (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 0 days. days.

(21) Appl. No.: 15/449,632

(22) Filed: Mar. 3, 2017

(65) Prior Publication Data

US 2017/0256711 A1 Sep. 7, 2017

(30) Foreign Application Priority Data

Mar. 4, 2016 (CN) .......................... 2016 1 0122457

(51) Int. Cl.
*H01L 45/00* (2006.01)

(52) U.S. Cl.
CPC .......... *H01L 45/1253* (2013.01); *H01L 45/16* (2013.01)

(58) Field of Classification Search
CPC ............... H01L 45/1253; H01L 45/126; H01L 45/1273; H01L 45/16; H01L 45/1675; H01L 27/2436

See application file for complete search history.

(56) References Cited

U.S. PATENT DOCUMENTS

| | | | |
|---|---|---|---|
| 6,236,590 B1 * | 5/2001 | Bhattacharyya | G11C 11/15 257/E27.005 |
| 9,147,837 B1 * | 9/2015 | Sutardja | G11C 13/0002 |
| 9,178,144 B1 * | 11/2015 | Sung | H01L 45/1253 |
| 9,577,186 B2 * | 2/2017 | Srinivasan | H01L 45/04 |
| 2008/0303015 A1 * | 12/2008 | Happ | G11C 13/0004 257/5 |
| 2011/0059576 A1 | 3/2011 | Cho et al. | |
| 2011/0140069 A1 | 6/2011 | Inoue | |

FOREIGN PATENT DOCUMENTS

| | | |
|---|---|---|
| TW | I431825 B | 3/2014 |
| TW | 201436190 A | 9/2014 |
| TW | 201503440 A | 1/2015 |
| TW | 201513180 A | 4/2015 |

* cited by examiner

*Primary Examiner* — Allison P Bernstein
(74) *Attorney, Agent, or Firm* — Muncy, Geissler, Olds & Lowe, P.C.

(57) ABSTRACT

A resistive random-access memory structure and a method for fabricating a resistive random-access memory structure are described. A first dielectric layer is formed on a substrate. A plurality of bottom electrodes are independently embedded in the first dielectric layer. A transition metal oxide layer covers the plurality of bottom electrodes and extends onto a portion of the first dielectric layer. The minimum distance between the bottom electrode and a sidewall of the transition metal oxide layer is a first distance. The first distance is in a range of 10 nm to 200 μm. A top electrode is formed on the transition metal oxide layer.

16 Claims, 14 Drawing Sheets

RESISTIVE RANDOM-ACCESS MEMORY STRUCTURE AND METHOD FOR FABRICATING THE SAME

CROSS REFERENCE TO RELATED APPLICATIONS

This Application claims priority of Chinese Application No. 201610122457.9, filed on Mar. 4, 2016 and entitled "RESISTIVE RANDOM-ACCESS MEMORY STRUCTURE AND METHOD FOR FABRICATING THE SAME", the entirety of which is incorporated by reference herein.

BACKGROUND

Field of the Disclosure

The present disclosure relates to a memory device, and in particular it relates to a resistive random-access memory structure and a method for fabricating the resistive random-access memory structure.

Description of the Related Art

Because stored data will not disappear while power being turned off, non-volatile memories are essential for various electronic products. Currently, resistive random access memory (RRAM) is a prosperous sort of non-volatile memory that has been developed for use in the industry. Resistive random access memory has great potential for use in personal computers and electronic devices because of its advantages such as low operating voltage, high writing/erasing speed, long memory-period, non-destructive read out, multi-state memorizing, simple structure, and small area.

However, in the production of resistive random access memory, along with the miniaturization of the device size, there are still many challenges that need to be overcome, such as uniformity of the resistive random access memory structure, and how to prevent damage to the bottom electrode caused by manufacturing processes. Therefore, a new resistive random access memory structure and an improved fabrication process are desirable.

BRIEF SUMMARY

The disclosure provides a resistive random access memory structure. The resistive random access memory structure may reduce the damage to the bottom electrode caused by the subsequent manufacturing processes.

The disclosure provides a resistive random access memory structure. The resistive random access memory structure includes a first dielectric layer formed on a substrate, a plurality of bottom electrodes independently embedded in the first dielectric layer, and a transition metal oxide layer covering the plurality of bottom electrodes and extends onto a portion of the first dielectric layer. The minimum distance between the bottom electrode and a sidewall of the transition metal oxide layer is a first distance. The first distance is in a range of 10 nm to 200 μm. The resistive random access memory structure further includes a top electrode formed on the transition metal oxide layer.

The disclosure provides a method for fabricating a resistive random access memory structure. The method includes forming a first dielectric layer on a substrate, patterning the first dielectric layer to form a plurality of first openings, forming a plurality of bottom electrodes in the plurality of first openings, and forming a transition metal oxide layer covering the plurality of bottom electrodes and extending onto a portion of the first dielectric layer. The minimum distance between the bottom electrode and a sidewall of the transition metal oxide layer is a first distance. The first distance is in a range of 10 nm to 200 μm. The method further includes forming a top electrode on the transition metal oxide layer.

In the resistive random access memory structure of the disclosure, the transition metal oxide layer covers the bottom electrodes, and the sidewall of the transition metal oxide layer is outside the sidewalls of the bottom electrodes. As a result, damage to the bottom electrode caused by subsequent manufacturing processes may be reduced.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
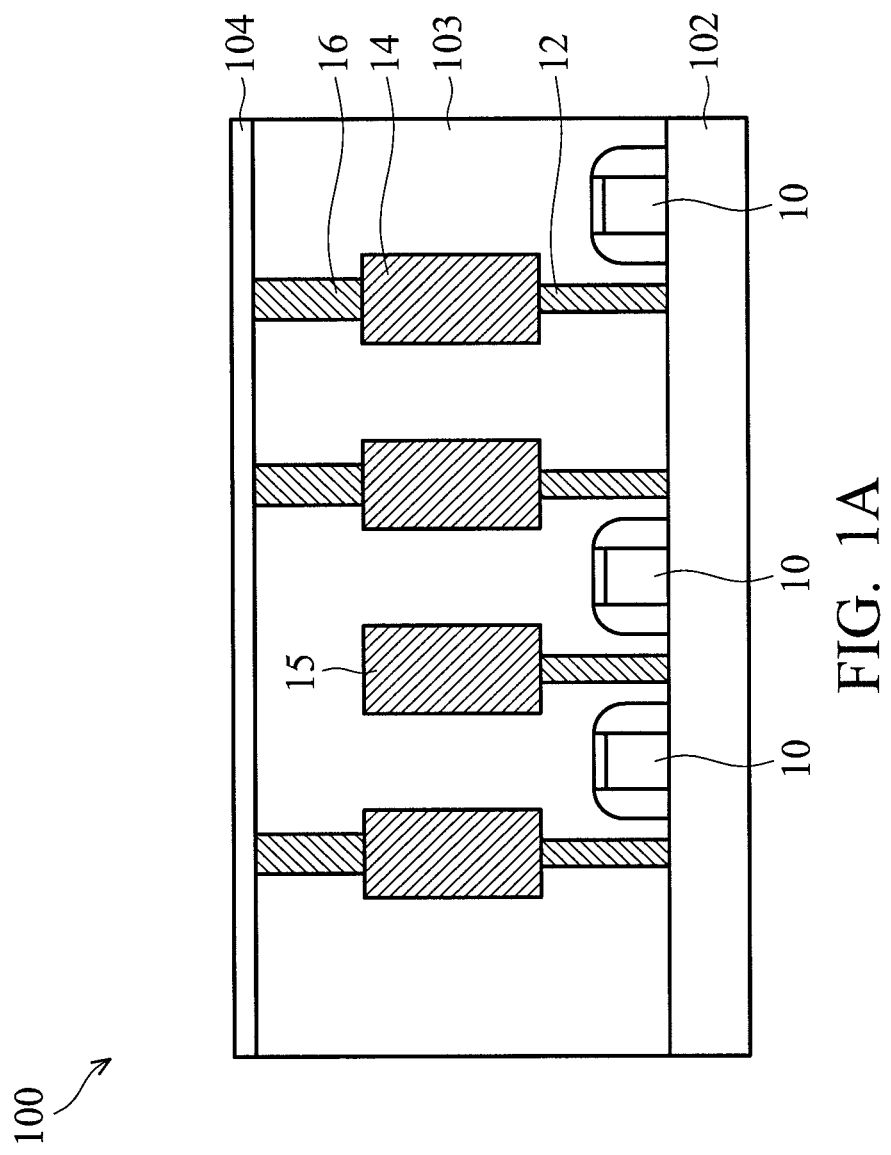
FIGS. 1A-1H show cross-sectional views of various stages of forming a resistive random access memory structure in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

FIGS. 1A-1H show cross-sectional views of various stages of forming a resistive random access memory structure 100 in accordance with some embodiments. Referring to FIG. 1A, a substrate 102 is provided, and a plurality of transistors 10 and a interlayer dielectric layer 103 have been formed on the substrate 102. The substrate 102 may be a silicon substrate, a silicon germanium substrate, a silicon carbide substrate, a silicon-on-insulator (SOI) substrate, a multi-layered substrate, a gradient substrate, or a hybrid orientation substrate. In one embodiment, the substrate 102 is a silicon wafer. In some embodiments, the material of the interlayer dielectric layer 103 may comprise silicon oxide, silicon nitride, silicon oxynitride, fluorine silicate glass (FSG), black diamond, low dielectric constant (low-k) dielectric material, a combination thereof, or other applicable dielectric material. The interlayer dielectric layer 103 may be formed by suitable processes, such as chemical vapor deposition (CVD) process, atomic layer deposition (ALD) process, thermal oxidation process, or another applicable process. In addition, metal plugs 12, metal layers 14, a common source conductive line 15, and bottom electrode contact plugs 16 are formed in the interlayer dielectric layer 103 and electrically connected to transistors 10, as shown in FIG. 1A. In some embodiments, some transistors 10 are dummy transistors.

Referring to FIG. 1A again, a first dielectric layer 104 is formed on the interlayer dielectric layer 103. The first dielectric layer 104 may comprise silicon oxide, silicon nitride, silicon oxynitride, fluorine silicate glass (FSG), black diamond, low dielectric constant (low-k) dielectric material, a combination thereof, or other applicable dielectric material. The first dielectric layer 104 may be formed by suitable processes, such as chemical vapor deposition (CVD) process, atomic layer deposition (ALD) process, thermal oxidation process, or another applicable process.

Figure 1B:
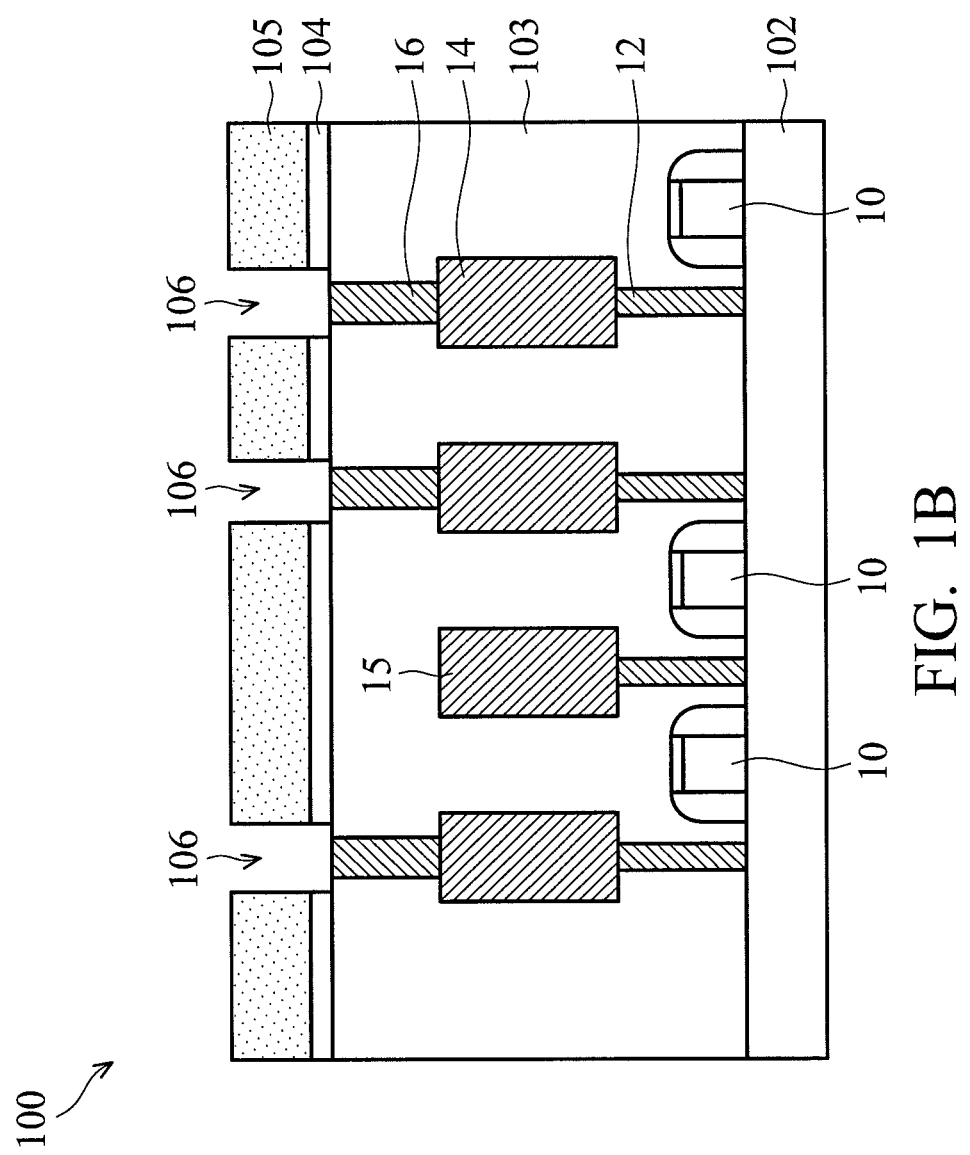

Then, as shown in FIG. 1B, the first dielectric layer 104 is patterned to form a plurality of first openings 106 in the first dielectric layer 104. The first openings 106 may be used to form bottom electrodes 108 in the subsequent processes (as shown in FIG. 1D). In some embodiments, a patterned photoresist layer 105 is formed on the first dielectric layer 104 by performing a lithography process. Then, an etching process is performed by using the patterned photoresist layer 105 as an etching mask, and the first dielectric layer 104 is etched to form the first openings 106 in the first dielectric layer 104. In some embodiments, the etching process may comprise a dry etching process, such as a reactive ion etching (RIE) process. In some embodiments, the bottom electrode contact plugs 16 in the interlayer dielectric layer 103 are exposed by the first openings 106. After the first openings 106 are formed, the photoresist layer 105 is removed.

Figure 1C:
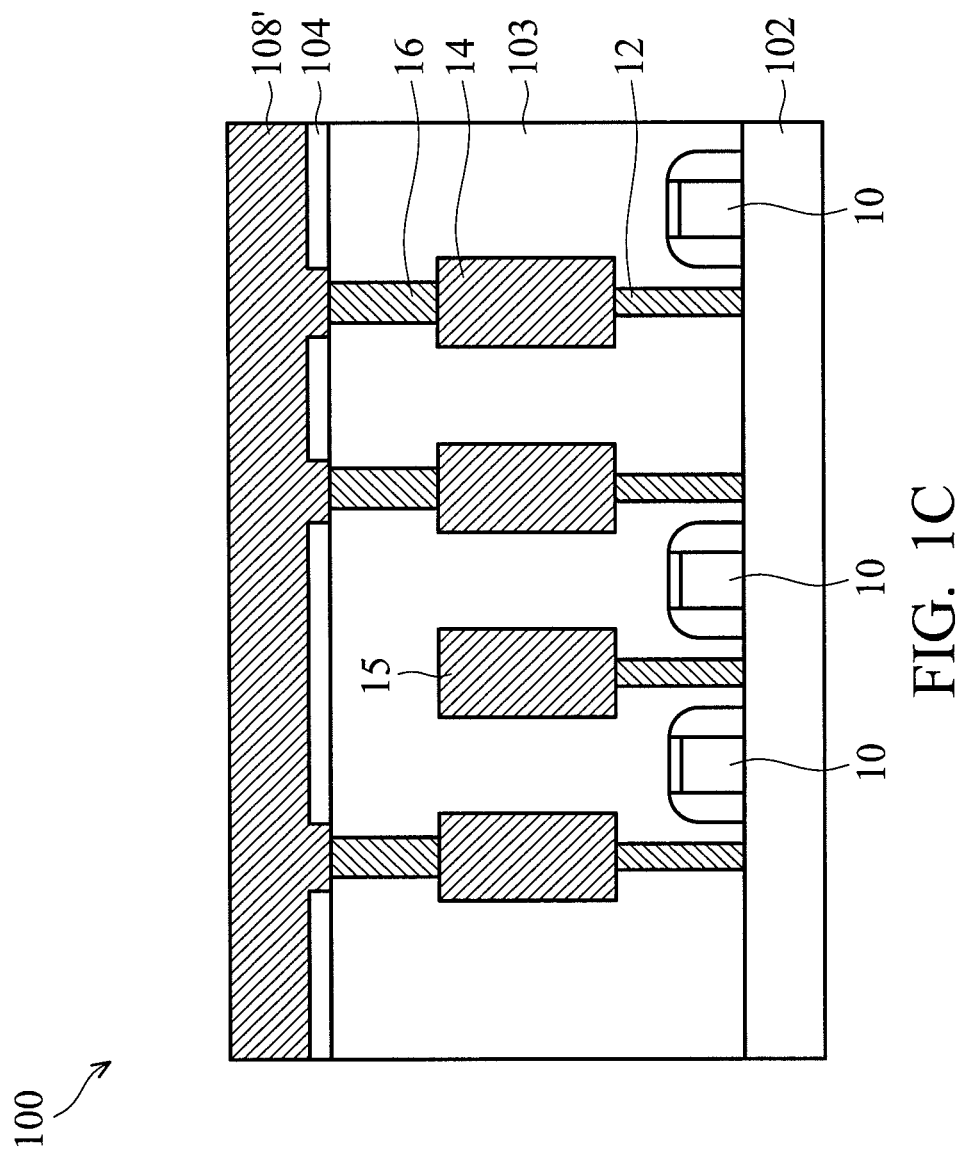
Figure 1D:
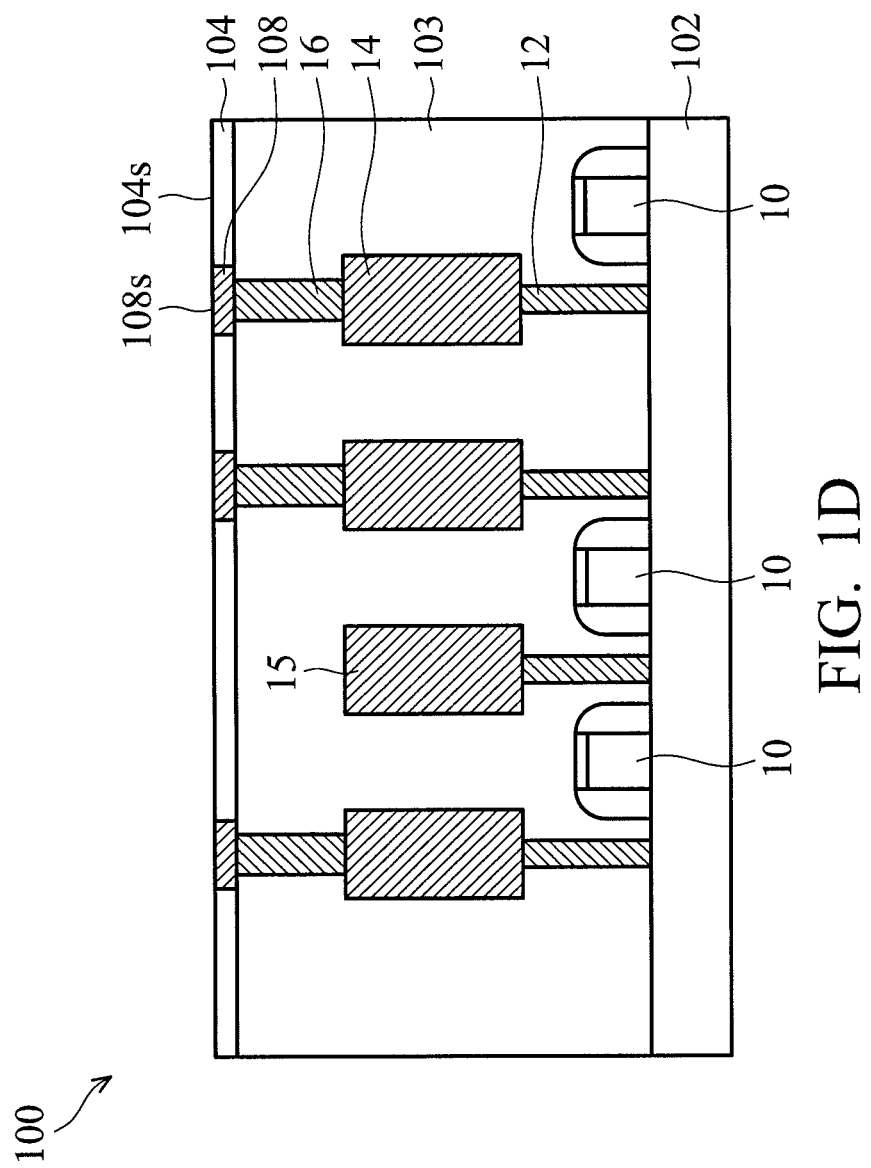

Next, referring to FIG. 1C, a bottom electrode material 108' is formed on the first dielectric layer 104. In this embodiment, the bottom electrode material 108' fills the first openings 106 and extends onto the first dielectric layer 104. In some embodiments, the method for forming the bottom electrode material 108' may be formed by suitable processes, such as physical vapor deposition (PVD) process, chemical vapor deposition process, atomic layer deposition process, or another applicable process. In some embodiments, the bottom electrode material 108' may be titanium (Ti), titanium nitride (TiN), platinum (Pt), tungsten (W), aluminum (Al), aluminum titanium nitride (TiAlN), a combination thereof, or the like. In some embodiments, after the bottom electrode material 108' is formed, a portion of the bottom electrode material 108' outside the first openings 106 is removed, and bottom electrodes 108 are formed in the first openings 106, as shown in FIG. 1D. In some embodiments, the portion of the bottom electrode material 108' outside the first openings 106 (such as the portion of the bottom electrode material 108' on the first dielectric layer 104) is removed by performing a planarization process (such as a chemical mechanical polishing process), and the bottom electrodes 108 are formed in the first openings 106, as shown in FIG. 1D. In some embodiments, the bottom electrodes 108 are electrically connected to the transistors 10 in the substrate by the metal plugs 12, the metal layers 14 and the bottom electrode contact plugs 16. In this embodiment, by the planarization process, the bottom electrodes 108 may be embedded in the first dielectric layer 104, and top surfaces 108s of the bottom electrodes 108 may be flat. Furthermore, the top surfaces 108s and a top surface 104s of the first dielectric layer 104 may be substantially coplanar. Therefore, the uniformity of the subsequent transition metal oxide layer and top electrode may be improved, and the variability of the electrical properties of the resistive random access memory structure 100 may be reduced. There are only three bottom electrodes 108 in the first dielectric layer 104, as shown in FIG. 1D. However, in other embodiments, the number of bottom electrodes 108 may be greater than three: four or more, for example.

Figure 1E:
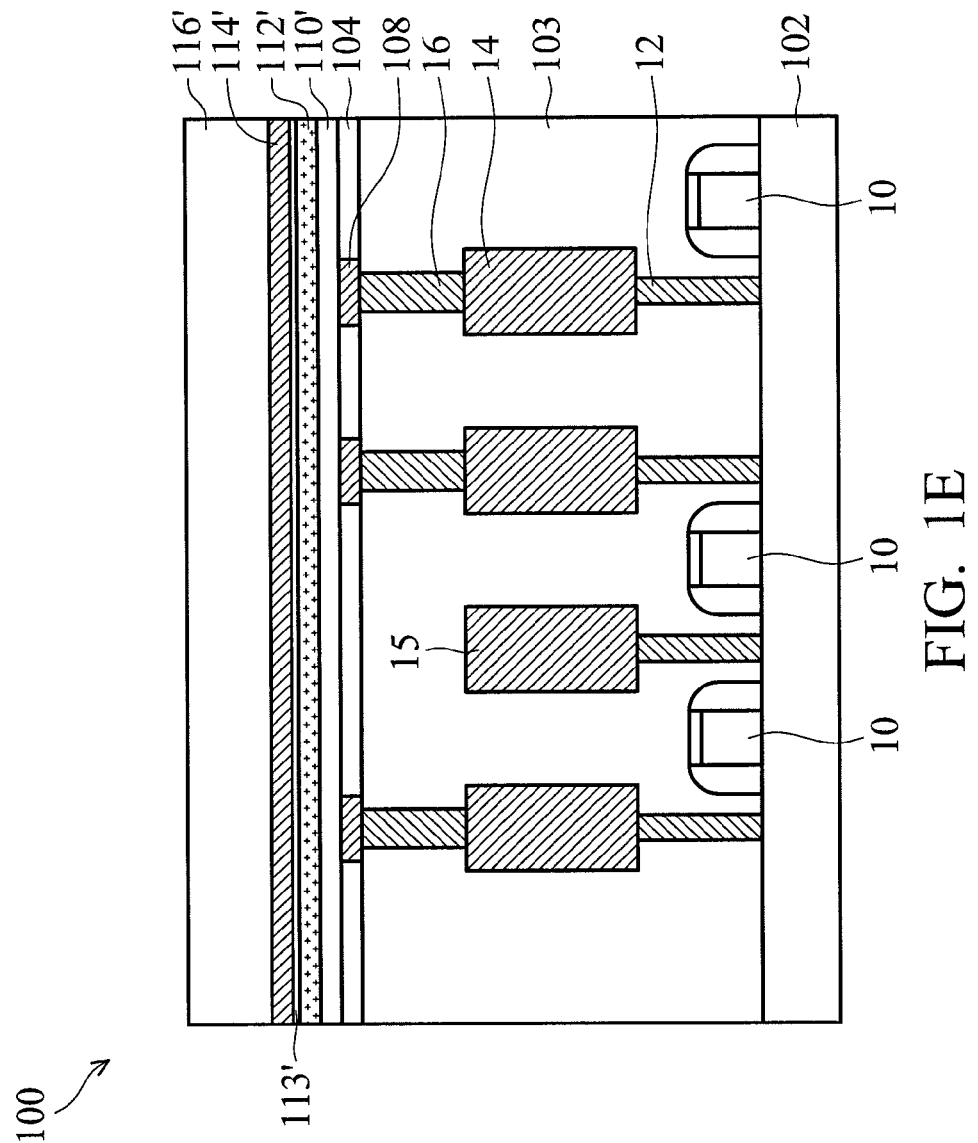

Then, referring to FIG. 1E, a transition metal oxide material 110', a top electrode material 114', and a second dielectric material 116' are sequentially formed on the bottom electrodes 108 and the first dielectric layer 104. In one embodiment, the transition metal oxide material 110' may comprise oxide of the transition metal, such as titanium dioxide ($TiO_2$), hafnium dioxide ($HfO_2$), zirconium dioxide ($ZrO_2$), aluminum oxide ($Al_2O_3$), tantalum oxide ($Ta_2O_5$), nickel oxide (NiO), zinc oxide (ZnO), a combination thereof, or the like. In some embodiments, the transition metal oxide material 110' may be formed by suitable processes, such as physical vapor deposition process, chemical vapor deposition process, atomic layer deposition process, or another applicable process. In some embodiments, the top electrode material 114' may comprise titanium (Ti), titanium nitride (TiN), platinum (Pt), tungsten (W), aluminum (Al), aluminum titanium nitride (TiAlN), a combination thereof, or the like. In some embodiments, the top electrode material 114' may be formed by suitable processes, such as physical vapor deposition process, chemical vapor deposition process, atomic layer deposition process, electron beam (E-beam) vacuum evaporation process, or sputtering. In some embodiments, the second dielectric material 116' may be silicon oxide, silicon nitride, silicon oxynitride, fluorine silicate glass (FSG), black diamond, low dielectric constant (low-k) dielectric material, a combination thereof, or another applicable dielectric material. The second dielectric material 116' may be formed by suitable processes, such as chemical vapor deposition process or another applicable process. In some embodiments, an additional oxygen-reaction material 112' may be optionally formed between the transition metal oxide material 110' and the top electrode material 114'. In some embodiments, the oxygen-reaction material 112' may be titanium (Ti), hafnium (Hf), tantalum (Ta), zirconium (Zr), aluminum (Al), nickel (Ni), a combination thereof, or the like. The oxygen-reaction material 112' may be formed by suitable processes, such as physical vapor deposition process, chemical vapor deposition process, or another applicable process. In some embodiments, a barrier material 113' may be formed between the oxygen-reaction material 112' and the top electrode material 114'. In some embodiments, the barrier material 113' may be used as a diffusion barrier layer which may prevent the oxygen atoms in the transition metal oxide layer 110 from diffusing into the top electrode 114 through the oxygen-reaction layer 112. The performance of the resistive random access memory structure 100 may be degraded due to the diffusion of the oxygen atoms. In some embodiments, the barrier material 113' may comprise a metal oxynitride ($MN_xO_y$), where M may be tantalum (Ta), titanium (Ti), tungsten (W), hafnium (Hf), nickel (Ni), aluminum (Al), pnictogen elements (such as antimony, bismuth), cobalt (Co) or zirconium (Zr), and the N content is about 5-30%. For example, the barrier material 113' may be aluminum oxide ($Al_2O_3$), zirconium oxide ($ZrO_2$), hafnium oxide ($HfO_2$), tantalum oxide ($Ta_2O_5$), or another applicable material. The barrier material 113' may be formed by suitable processes, such as physical vapor deposition process, chemical vapor deposition process, atomic layer deposition process, or another applicable process.

Figure 1F:
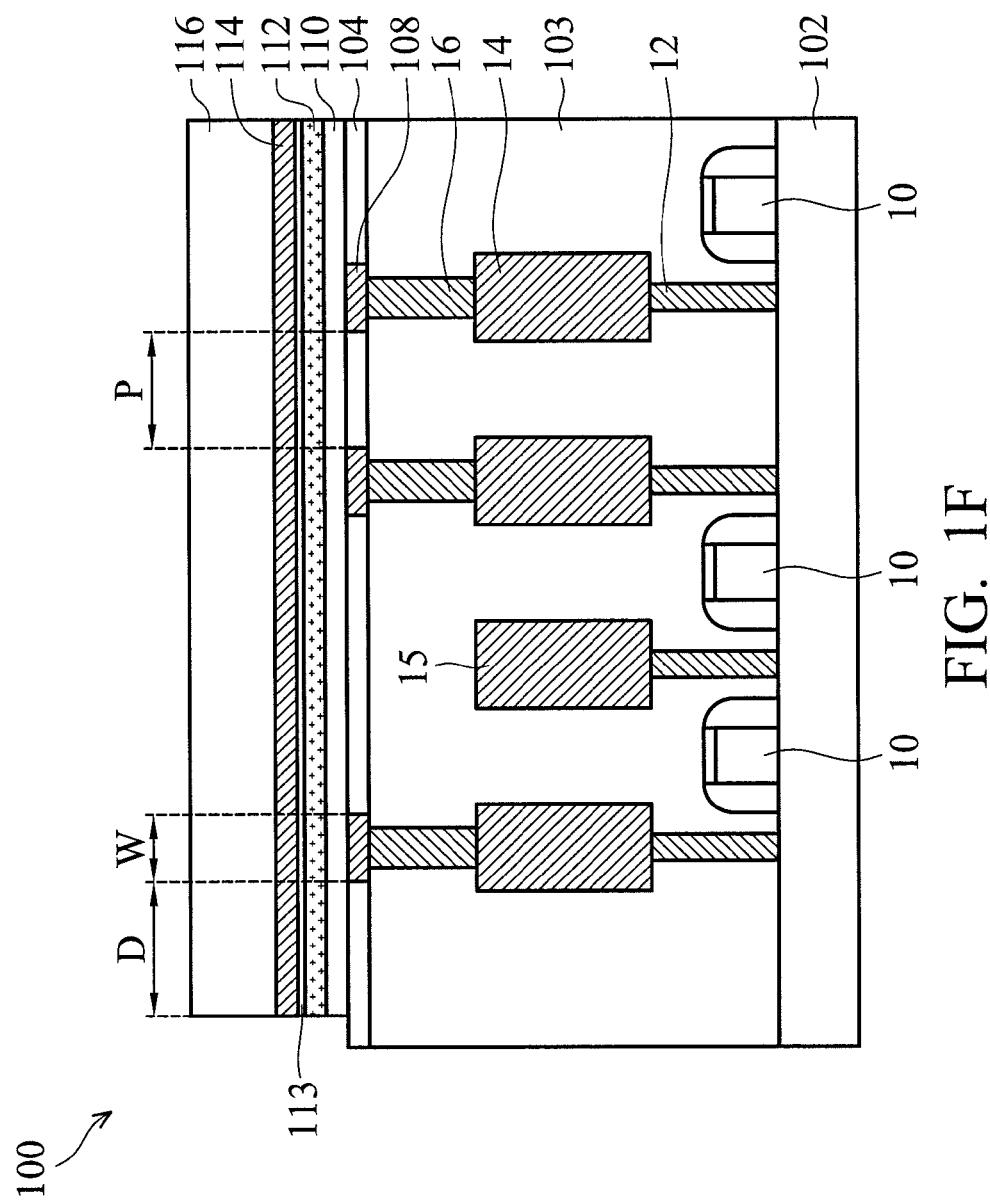

Next, referring to FIG. 1F, the transition metal oxide material 110', the oxygen-reaction material 112', the barrier material 113', the top electrode material 114', and the second dielectric material 116' are patterned to form a transition metal oxide layer 110, an oxygen-reaction layer 112, a barrier layer 113, a top electrode 114, and a second dielectric layer 116, and a portion of the first dielectric layer 104 is exposed. In this embodiment, one continuously disposed top electrode 114 may cover a plurality of bottom electrodes 108. In some embodiments, the transition metal oxide material 110', the oxygen-reaction material 112', the barrier material 113', the top electrode material 114', and the second dielectric material 116' are sequentially patterned by a lithography process and an anisotropic etching process (e.g., reactive ion etching process). In some embodiments, the transition metal oxide layer 110, the oxygen-reaction layer 112, the barrier layer 113, the top electrode 114, and the second dielectric layer 116 cover a plurality of bottom electrodes 108 and extend onto a portion of the first dielectric layer 104.

During the reactive ion etching process, the plasma produced by the process may react with the adjacent bottom electrodes 108, and the bottom electrodes 108 may be damaged. In one embodiment of this disclosure, the sidewall of the transition metal oxide layer 110 is far away from the bottom electrodes 108, and the transition metal oxide layer 110 covers a plurality of bottom electrodes 108. Therefore, the damage caused by the plasma of the process may be avoided. As a result, the variability of the electrical properties of the resistive random access memory structure 100 may be reduced. In some embodiments, as shown in FIG. 1F, the bottom electrode 108 closest to the sidewall of the transition metal oxide layer 110 has a first width W, and a minimum space between this bottom electrode 108 and the sidewall of the transition metal oxide layer 110 is a first distance D. The first distance D is in a range of 10 nm to 200 μm, for example, about 1.5 μm. In some embodiments, two adjacent bottom electrodes 108 may have a minimum space P, as shown in FIG. 1F. Preferably, the ratio of the first distance D to the minimum space P may be in a range of 1/10 to 10. For example, when the minimum space P is 100 nm, the first distance D may be any value between 10-1000 nm. The first width W is in a range of about 100-200 nm, for example, about 150 nm. In some embodiments, the first distance D may be not smaller than the first width W. In some embodiments, the ratio W:D of the first width W and the first distance D is in a range of 1:1 to 1:2000.

Furthermore, the number of bottom electrodes 108 covered by one continuous transition metal oxide layer 110 may be greater than 2. Therefore, except for the bottom electrodes 108 adjacent the outmost sidewalls of the transition metal oxide layer 110, each sidewall of the rest of the bottom electrodes 108 is completely covered by the transition metal oxide layer 110, and will not be damaged by the plasma. In addition, by controlling the first distance D in a range of 10 nm to 200 μm, the bottom electrodes 108 adjacent the outmost sidewalls of the transition metal oxide layer 110 will also not be damaged by the plasma. Preferably, the first distance D is not smaller than the first width W.

Figure 1G:
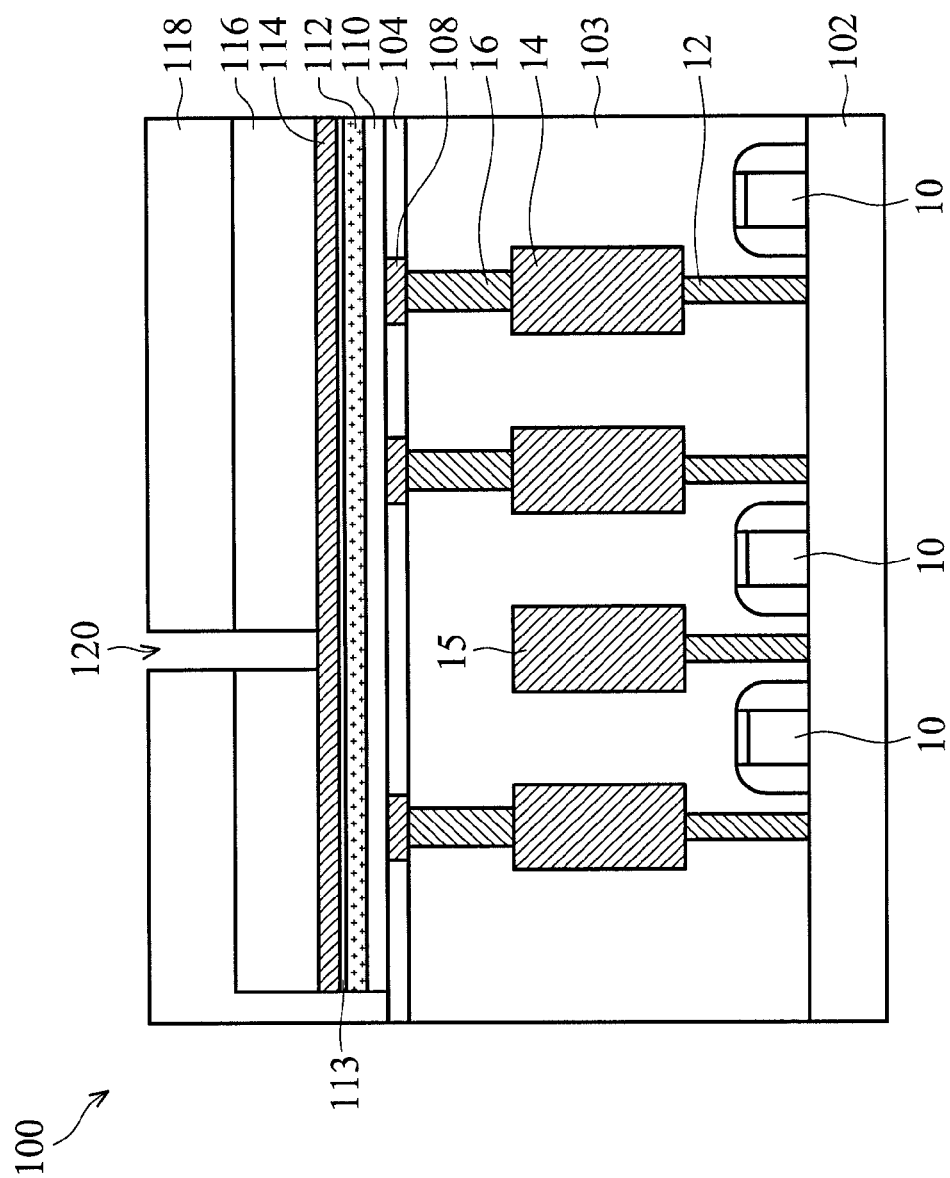
Figure 1H:
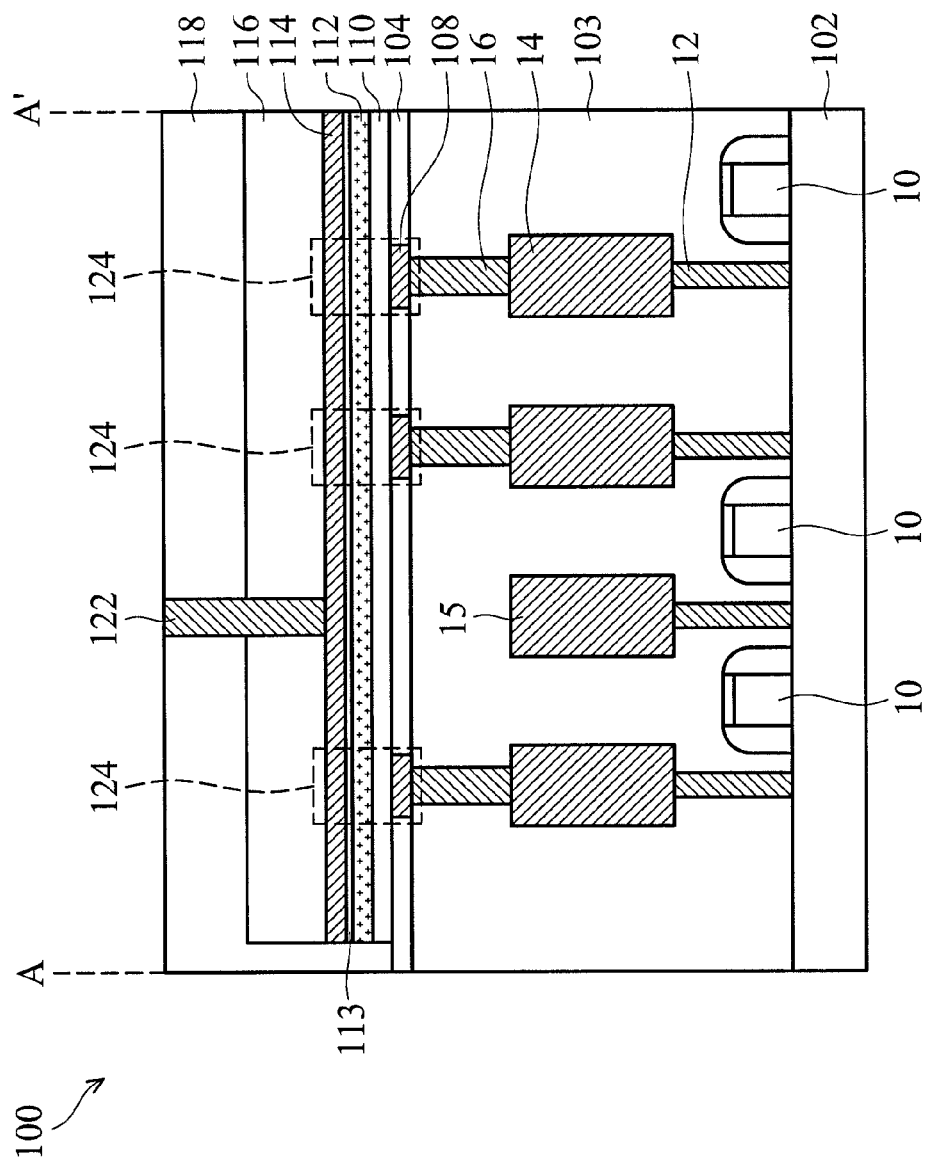

Next, referring to FIG. 1G, a third dielectric layer 118 is formed on the substrate 102 and covers the second dielectric layer 116 and the exposed first dielectric layer 114. In some embodiments, the material of the third dielectric layer 118 may be silicon oxide, silicon nitride, silicon oxynitride, fluorine silicate glass (FSG), black diamond, low dielectric constant (low-k) dielectric material, a combination thereof, or other applicable dielectric material. The third dielectric layer 118 may be formed by suitable processes, such as chemical vapor deposition process, high density plasma chemical vapor deposition (HDPCVD) process, or another applicable process. Then, the third dielectric layer 118 and the second dielectric layer 116 are patterned by a lithography process and an anisotropic etching process (e.g., reactive ion etching process) to form a second opening 120, and a portion of the top electrode 114 is exposed. In some embodiments, the second opening 120 and any one of the underlying bottom electrodes 108 are misaligned, as shown in FIG. 1G. In this embodiment, the second opening 120 may be disposed corresponding to the common source conductive line 15. As a result, the second opening 120 and the active region 124 are misaligned (as shown in FIG. 1H), and the probable damage to the top electrode 114 in the active region 124 during the process of forming the second opening 120 may be prevented. The active regions 124 are the working region of the resistive random access memory structure 100.

Referring to FIG. 1H, conductive material is filled into the second opening 120. Then an etching back or a planarization process (such as a chemical mechanical polishing process), is performed to remove the excess conductive material on the top surface of the third dielectric layer 118, and a via plug 122 is formed in the second opening 120. The via plug 122 is electrically connected to the top electrode 114, and the fabrication process of the resistive random access memory structure 100 is completed. In some embodiments, the material of the via plug may comprise tungsten (W), copper (Cu), a combination thereof, or the like. In this embodiment, one via plug 122 may correspond to a plurality of bottom electrodes 108, as shown in FIG. 1H. Therefore, the plurality of bottom electrodes 108 may be controlled by one via plug 122, and a plurality of transistors 10 in the interlayer dielectric layer 103 may also be controlled by this via plug 122.

Figure 3:
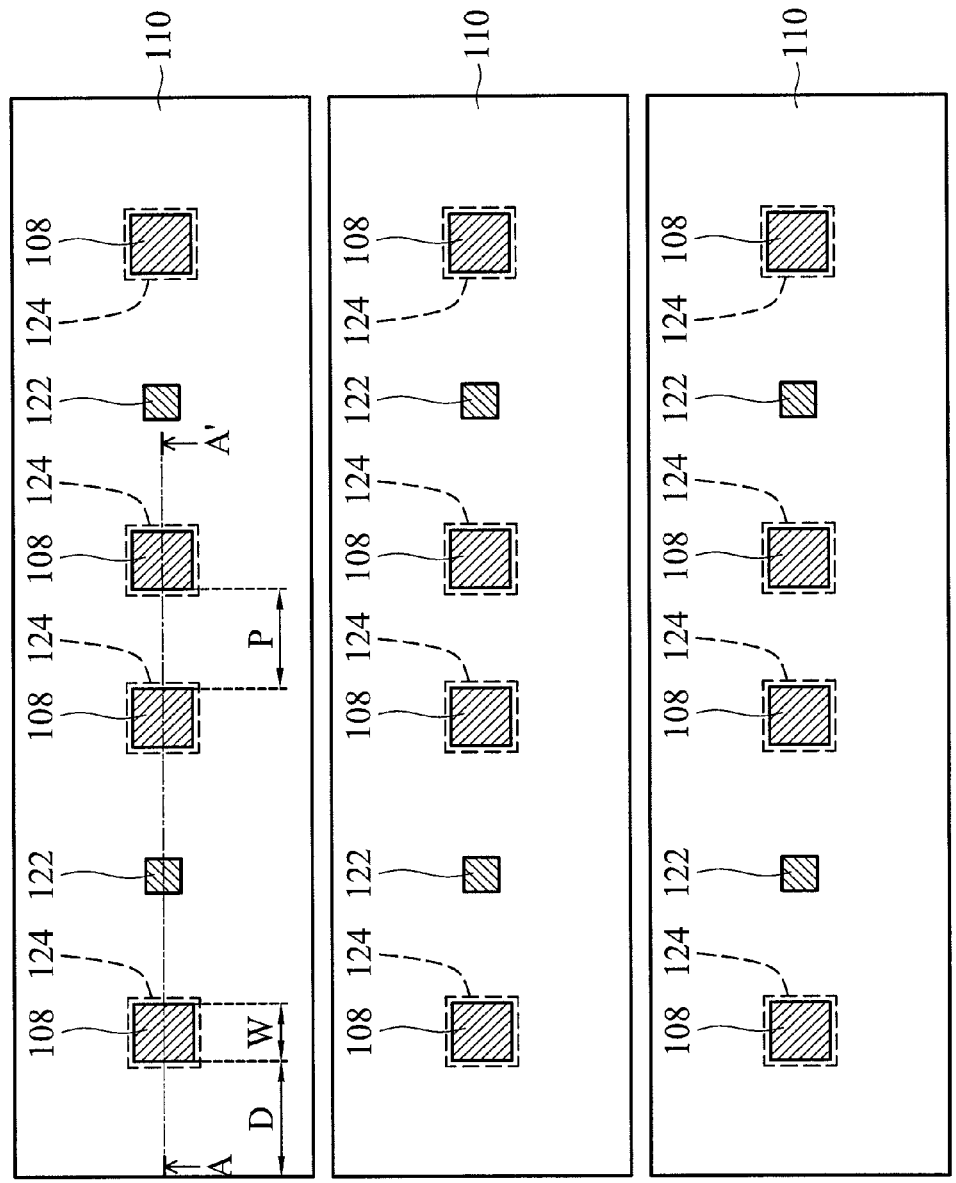
FIG. 3 shows a perspective top-view of the resistive random access memory structure of FIG. 1H.

FIG. 3 shows a perspective top-view of the resistive random access memory structure 100 of FIG. 1H. FIG. 1H is cross-sectional representation taken along line A-A' of FIG. 3. Referring to FIG. 3, in the resistive random access memory structure 100, a plurality of transition metal oxide layers 110 are arranged in an array. There are, for example, four bottom electrodes 108 formed within each one of the plurality of transition metal oxide layers 110. There is a shortest first distance between the bottom electrode 108 and the sidewall of the transition metal oxide layers 110, and the first distance is in a range of 10 nm to 200 μm. As described above, the distance between the sidewall of the transition metal oxide layer 110 and the sidewall of the bottom electrodes 108 is far enough. Therefore, damage to the bottom electrodes 108 caused by the plasma may be avoided, and the variability of the electrical properties of the resistive random access memory structure 100 may be reduced.

Still referring to FIG. 3, one via plug 122 is disposed between two bottom electrodes 108 within each transition metal oxide layer 110. Therefore, damage to the top electrode 114 in the active region 124 caused by the reactive ion etching process may be avoided, and the variability of the electrical properties of the resistive random access memory structure 100 may be reduced.

There are only two via plugs 122 and four bottom electrodes 108 formed within one transition metal oxide layer 110, as shown in FIG. 3. However, in other embodiments, there may be more top electrodes 114 and more bottom electrodes 108 formed within one transition metal oxide layer 110.

Figure 2A:
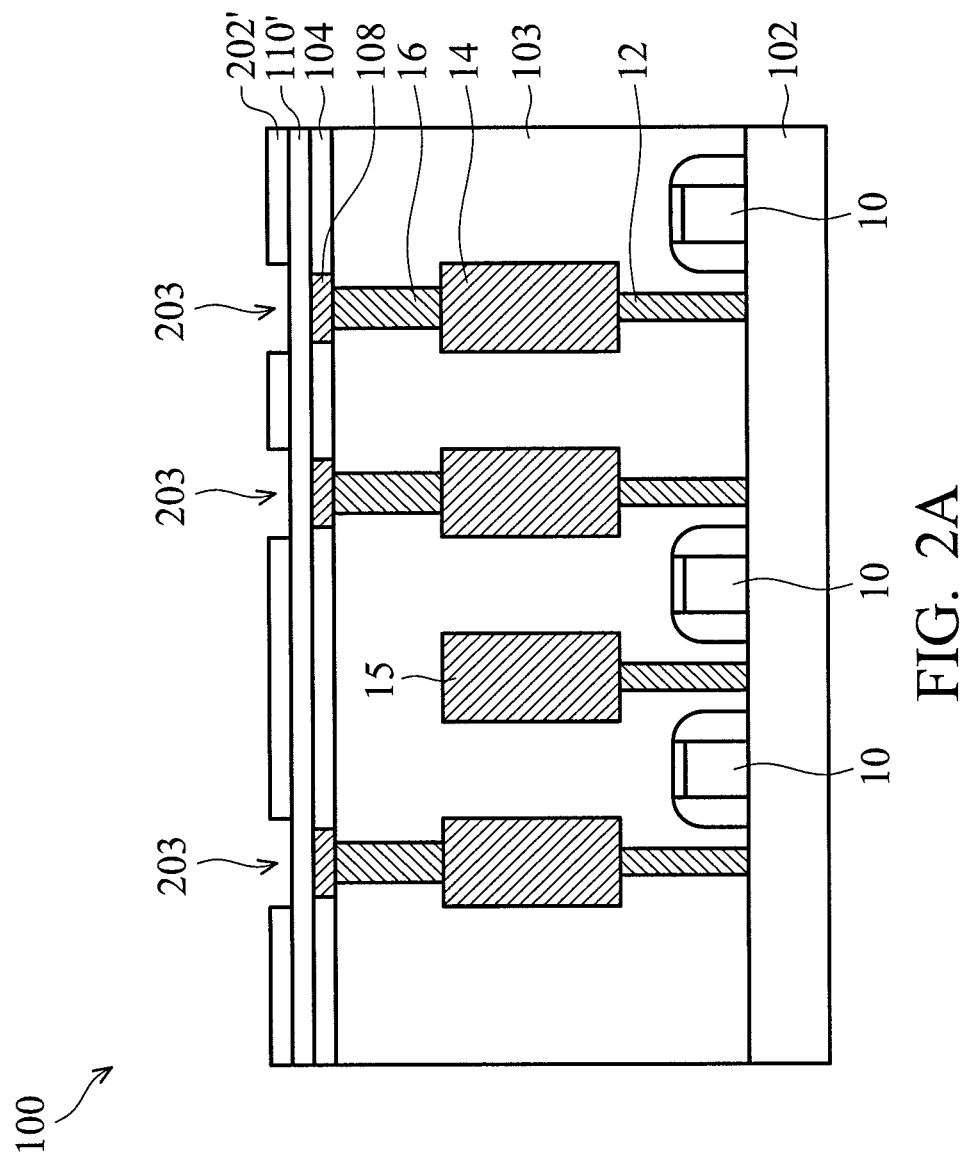
FIGS. 2A-2E show cross-sectional views of various stages of forming a resistive random access memory structure in accordance with other embodiment.

FIGS. 2A-2E show cross-sectional views of various stages of forming a resistive random access memory structure 100 in accordance with other embodiment. Firstly, referring to FIG. 2A, a transition metal oxide material 110' is formed on the first dielectric layer 104 and the bottom electrodes 108 of the resistive random access memory structure 100 shown in FIG. 1D. In some embodiments, the material and the formation method of the transition metal oxide material 110' may be the same as or similar to those of the transition metal oxide material 110' shown in FIG. 1E, and the detailed will not be repeated here. Then, a dielectric layer is deposited on the transition metal oxide material 110' by a deposition process, such as chemical vapor deposition process, spin coating process, or another applicable process. Then, the dielectric layer is patterned to form a fourth dielectric material 202' which has openings 203. In some embodiments, the fourth dielectric material 202' may comprise silicon oxide, silicon oxynitride, silicon borophosphosilicate glass (BPSG) nitride, phosphosilicate glass (PSG), other applicable dielectric material, or a combination thereof. In some embodiments, the openings 203 are disposed respectively corresponding to the bottom electrodes 108, as shown in FIG. 2A. In some embodiments, the openings 203 have a width in a range of 0.05-0.2 µm.

Figure 2B:
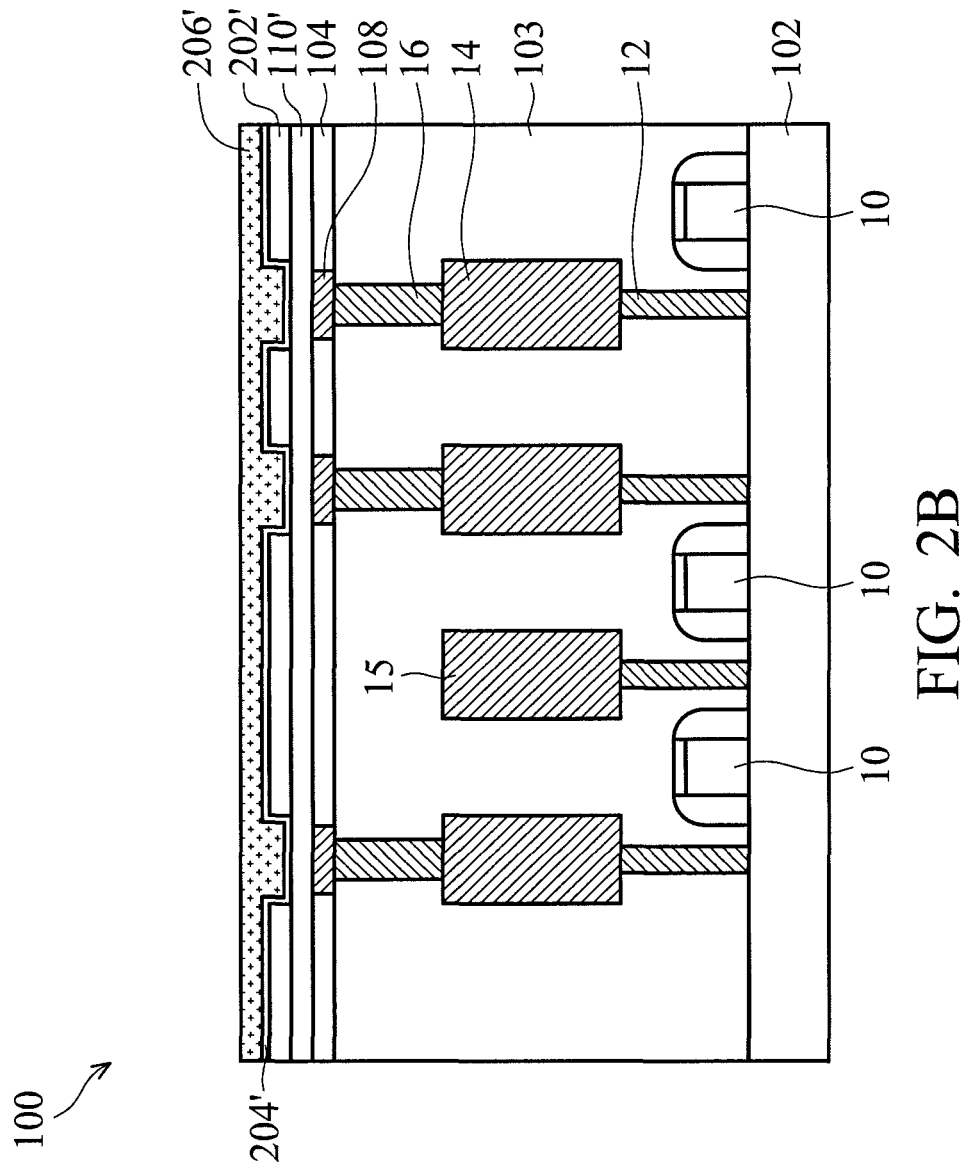

Then, referring to FIG. 2B, a barrier material 204' is conformally formed in the openings 203 and extends onto the fourth dielectric material 202'. In other words, after the barrier material 204' is filled into the openings 203, the top surface of the barrier material 204' in the openings 203 is still lower than the top surface of the barrier material 204' on the fourth dielectric material 202'. That is, the thickness of the barrier material 204' is smaller than the depth of the openings 203, and therefore, the openings 203 cannot be completely filled with the barrier material 204'. In some embodiments, the barrier material 204' may comprise a metal oxynitride ($MN_xO_y$), where M may be tantalum (Ta), titanium (Ti), tungsten (W), hafnium (Hf), nickel (Ni), aluminum (Al), pnictogen elements (such as antimony or bismuth), cobalt (Co) or zirconium (Zr), and the N content is about 5-30%. For example, the barrier material 204' may be aluminum oxide ($Al_2O_3$), zirconium oxide ($ZrO_2$), hafnium oxide ($HfO_2$), tantalum oxide ($Ta_2O_5$), or another applicable material. The barrier material 204' may be formed by suitable processes, such as physical vapor deposition process, chemical vapor deposition process, atomic layer deposition process, or another applicable process. Next, an oxygen-reaction material 206' is deposited to completely fill the openings 203 and to extend onto the barrier material 204'. In some embodiments, the oxygen-reaction material 206' may be titanium (Ti), hafnium (Hf), tantalum (Ta), zirconium (Zr), aluminum (Al), nickel (Ni), a combination thereof, or the like. The oxygen-reaction material 206' may be formed by suitable processes, such as physical vapor deposition process, chemical vapor deposition process, or another applicable process.

Figure 2C:
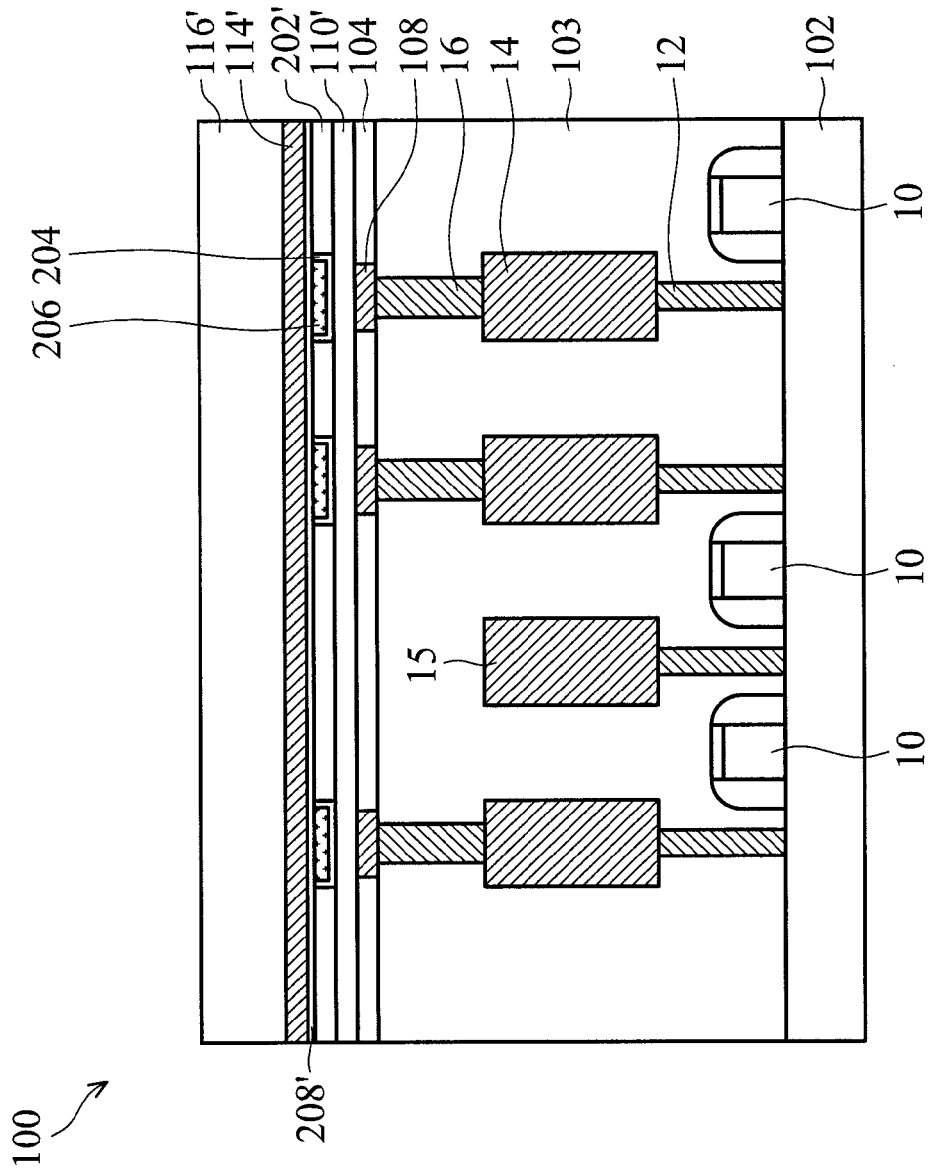

Next, referring to FIG. 2C, a planarization process (such as a chemical mechanical polishing process), is performed to remove the portions of the barrier material 204' and the oxygen-reaction material 206' outside the openings 203 (i.e., the portions on the fourth dielectric material 202'), and a discontinuous oxygen-reaction layer 206 and a plurality of barrier layers 204 are formed in the openings 203. In some embodiments, the discontinuous oxygen-reaction layer 206 comprises a plurality of portions separated from one another, and these separated portions are respectively located in the openings 203 and disposed corresponding to the bottom electrodes 108. The barrier layers 204 are on the bottom and the sidewalls of the openings 203, and respectively surround each one of the separated portions of the oxygen-reaction layer 206, as shown in FIG. 2C. The top surface of the discontinuous oxygen-reaction layer 206 and the top surface of the fourth dielectric material 202' may be substantially coplanar by the above planarization process. Therefore, the uniformity of the subsequent top electrode may be improved, and the variability of the electrical properties of the resistive random access memory structure 100 may be reduced.

Next, a barrier material 208' is formed on the fourth dielectric material 202', the barrier layers 204, and the discontinuous oxygen-reaction layer 206. The material and the formation method of the barrier material 208' may be the same as or similar to those of the barrier material 204' shown in FIG. 2B, and the detailed will not be repeated here. Then, a top electrode material 114' and a second dielectric material 116' are sequentially formed on the barrier material 208'. The material and the formation method of the top electrode material 114' and the second dielectric material 116' may be the same as or similar to those of the top electrode material 114' and the second dielectric material 116' shown in FIG. 1E, and the detailed will not be repeated here.

Figure 2D:
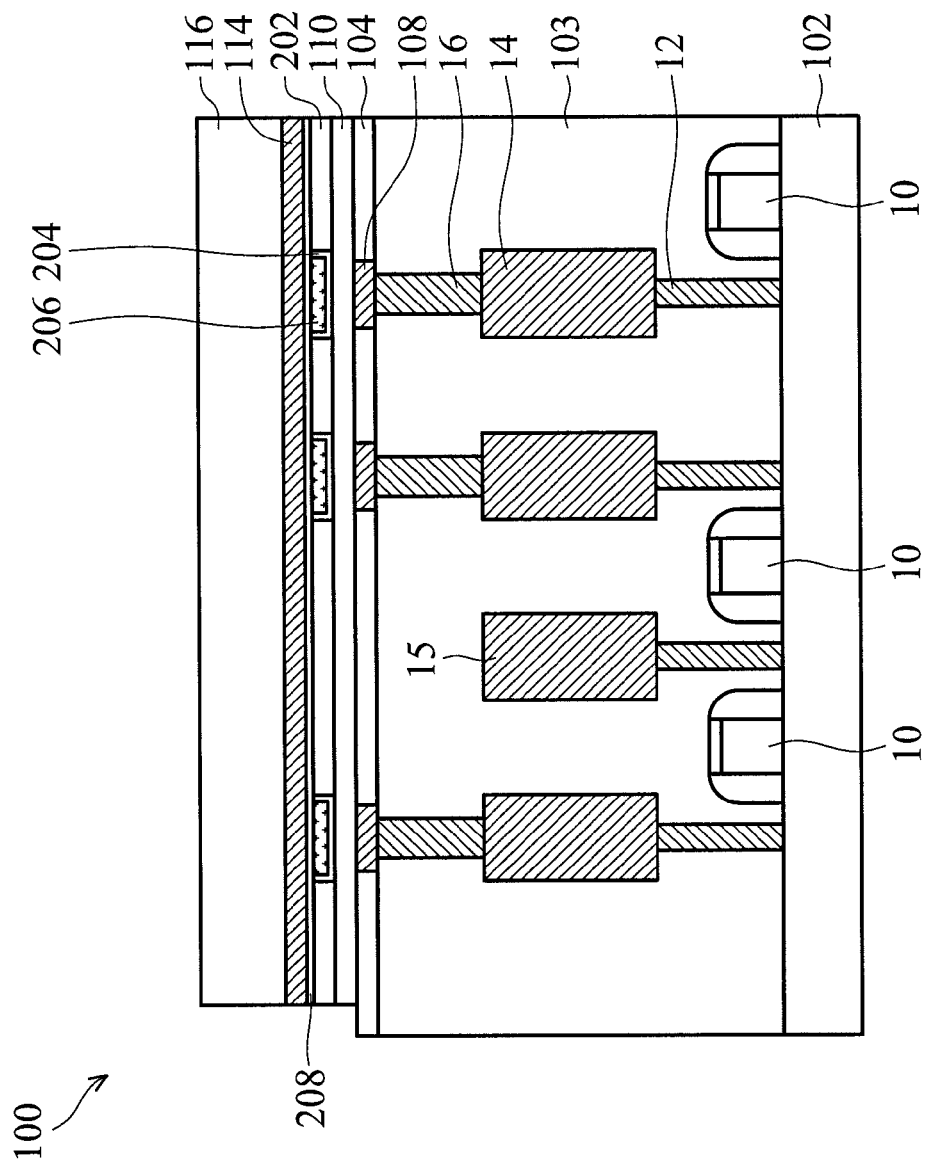

Next, referring to FIG. 2D, the transition metal oxide material 110', the fourth dielectric material 202', the barrier material 208', the top electrode material 114', and the second dielectric material 116' are patterned to form a transition metal oxide layer 110, a fourth dielectric layer 202, a barrier layer 208, a top electrode 114, and a second dielectric layer 116, and a portion of the first dielectric layer 104 is exposed. In some embodiments, the transition metal oxide layer 110 covers a plurality of bottom electrodes 108 and extends onto a portion of the first dielectric layer 104.

Figure 2E:
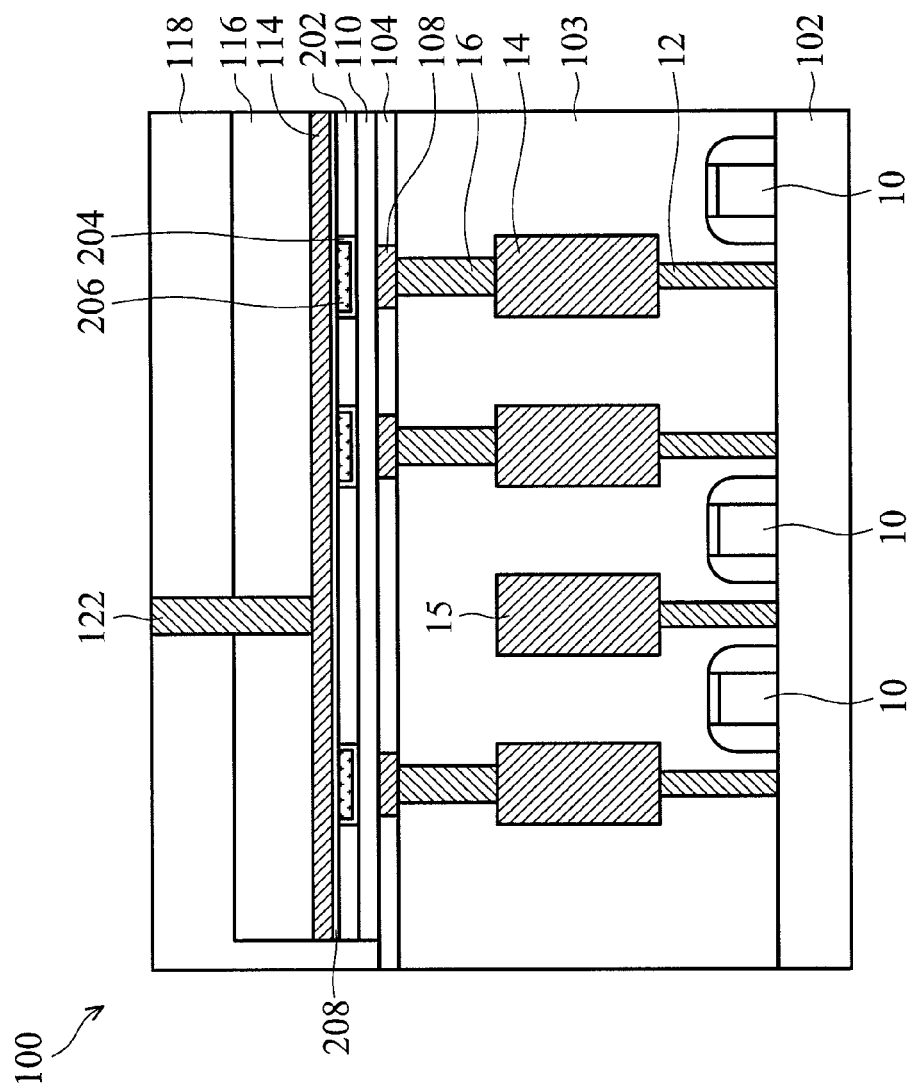

Next, referring to FIG. 2E, a third dielectric layer 118 is formed on the substrate 102 and covers the second dielectric layer 116 and the exposed first dielectric layer 104. Then, a via plug 122 is formed to pass through the third dielectric layer 118 and the second dielectric layer 116. The via plug 122 is electrically connected to the top electrode 114, and the fabrication process of the resistive random access memory structure 100 is completed.

As shown in FIG. 2E, in some embodiments of this disclosure, the positions where the conductive filaments formed in the transition metal oxide layer 110 may be precisely controlled by the discontinuous oxygen-reaction layer 206 and the bottom electrodes 108, such that the positions of the conductive filaments may correspond to the positions of the discontinuous oxygen-reaction layer 206 and the bottom electrodes 108. Because the discontinuous oxygen-reaction layer 206 and the bottom electrodes 108 configured to form the conductive filaments are far away from the sidewall of the transition metal oxide layer 110, damage to the conductive filaments caused by the plasma of the patterning processes may be reduced. Therefore, the endurance performance of the device may also be significantly improved by the discontinuous oxygen-reaction layer 206. In addition, because the discontinuous oxygen-reaction layer 206 is completely wrapped by the barrier layer 204 and the barrier layer 208, the conductive filaments are limited within the specific regions where the transition metal oxide layer 110 aligns to the discontinuous oxygen-reaction layer 206. Therefore, high density of the oxygen vacancies may be obtained, and the high-temperature data retention (HTDR) properties of the device may be improved.

As described above, in one embodiment of this disclosure, the top surface 108s of the bottom electrodes 108 and the top surface 104s of the first dielectric layer 104 are substantially coplanar by a planarization process during the manufacturing processes of the resistive random access memory structure. Therefore, the uniformity of the subsequent transition metal oxide layer 110 and top electrode 114 can be improved. Furthermore, in one embodiment of this disclosure, because there is a first distance D between the bottom electrode 108 and the sidewall of the transition metal oxide layer, the plasma produced in the reactive ion etching process for patterning the transition metal oxide layer 110 can be far away from the bottom electrode 108. Therefore, damage to the bottom electrode 108 can be avoided. In addition, in one embodiment of this disclosure, because the second opening 120 and any one of the underlying bottom electrodes 108 are misaligned, the plasma produced during the reactive ion etching process for patterning third dielectric layer 118 and the second dielectric layer 116 can be far away from the top electrode 114. Therefore, damage to the top electrode 114 can be avoided. Furthermore, because a plurality of bottom electrodes 108 are covered by one transition metal oxide layer 110, damage to the bottom electrodes 108 caused by the plasma during the manufacturing processes can be reduced. All the advantages described above can significantly reduce the variability of the electrical properties of the resistive random access memory structure 100. In addition, in one embodiment of this disclosure, a plurality of bottom electrodes 108 can be controlled by one via plug 122, and a plurality of transistors 10 in the interlayer dielectric layer 103 can also be controlled by this via plug 122.

In other embodiments of this disclosure, because of the discontinuous oxygen-reaction layer 206, the conductive filaments in the transition metal oxide layer 110 can be far away from the sidewall of the transition metal oxide layer 110 and will not be damaged by the plasma during the manufacturing processes. Therefore, the endurance performance of the device may also be significantly improved. Furthermore, because the discontinuous oxygen-reaction layer 206 is completely wrapped by the barrier layer 204 and the barrier layer 208, the conductive filaments can be limited within the specific regions. Therefore, high density of the oxygen vacancies can be obtained, and the high-temperature data retention properties of the device can be improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A resistive random-access memory structure, comprising:
    a first dielectric layer formed on a substrate;
    a plurality of bottom electrodes independently embedded in the first dielectric layer;
    a transition metal oxide layer covering the plurality of bottom electrodes and extending onto a portion of the first dielectric layer, wherein a minimum distance between the bottom electrode and a sidewall of the transition metal oxide layer is a first distance, and wherein the first distance is in a range of 10 nm to 200 µm;
    a top electrode formed on the transition metal oxide layer.

2. The resistive random-access memory structure as claimed in claim 1, wherein the bottom electrode closest to the sidewall of the transition metal oxide layer has a first width, and wherein the first distance is not smaller than the first width.

3. The resistive random-access memory structure as claimed in claim 2, wherein a ratio of the first width to the first distance is in a range of 1:1 to 1:2000.

4. The resistive random-access memory structure as claimed in claim 2, wherein the plurality of bottom electrodes comprises a minimum space, and wherein a ratio of the first distance to the minimum space is in a range of 1/10 to 10.

5. The resistive random-access memory structure as claimed in claim 1, wherein top surfaces of the plurality of bottom electrodes and a top surface of the first dielectric layer are substantially coplanar.

6. The resistive random-access memory structure as claimed in claim 1, further comprising an oxygen-reaction layer between the top electrode and the transition metal oxide layer, wherein the oxygen-reaction layer comprises titanium, hafnium, tantalum, zirconium, aluminum, nickel, or a combination thereof.

7. The resistive random-access memory structure as claimed in claim 6, wherein the oxygen-reaction layer comprises a plurality of portions separated from one another, and wherein the plurality of portions respectively correspond to the plurality of bottom electrodes.

8. The resistive random-access memory structure as claimed in claim 1, further comprising:
    a second dielectric layer formed on the top electrode;
    a via plug embedded in the second dielectric layer and electrically connected to the top electrode, wherein the via plug and any one of the plurality of bottom electrodes are misaligned.

9. A method for fabricating a resistive random-access memory structure, comprising:
    forming a first dielectric layer on a substrate;
    patterning the first dielectric layer to form a plurality of first openings;
    forming a plurality of bottom electrodes in the plurality of first openings;
    forming a transition metal oxide layer covering the plurality of bottom electrodes and extending onto a portion of the first dielectric layer, wherein a minimum distance between the bottom electrode and a sidewall of the transition metal oxide layer is a first distance, and wherein the first distance is in a range of 10 nm to 200 µm;
    forming a top electrode on the transition metal oxide layer.

10. The method for fabricating a resistive random-access memory structure as claimed in claim 9, wherein the bottom electrode closest to the sidewall of the transition metal oxide layer has a first width, and wherein the first distance is not smaller than the first width.

11. The method for fabricating a resistive random-access memory structure as claimed in claim 10, wherein a ratio of the first width to the first distance is in a range of 1:1 to 1:2000.

12. The method for fabricating a resistive random-access memory structure as claimed in claim 10, wherein the plurality of bottom electrodes comprises a minimum space, and wherein a ratio of the first distance to the minimum space is in a range of 1/10 to 10.

13. The method for fabricating a resistive random-access memory structure as claimed in claim 9, wherein forming the plurality of bottom electrodes comprises:
  filling a bottom electrode material into the plurality of first openings, wherein the bottom electrode material extends onto the first dielectric layer; and
  performing a planarization process to remove a portion of the bottom electrode material outside the plurality of first openings and form the plurality of bottom electrodes in the plurality of first openings, wherein top surfaces of the plurality of bottom electrodes and a top surface of the first dielectric layer are substantially coplanar.

14. The method for fabricating a resistive random-access memory structure as claimed in claim 13, further comprising forming an oxygen-reaction layer between the top electrode and the transition metal oxide layer, wherein the oxygen-reaction layer comprises titanium, hafnium, tantalum, zirconium, aluminum, nickel, or a combination thereof.

15. The method for fabricating a resistive random-access memory structure as claimed in claim 14, wherein the oxygen-reaction layer comprises a plurality of portions separated from one another, and wherein the plurality of portions respectively correspond to the plurality of bottom electrodes.

16. The method for fabricating a resistive random-access memory structure as claimed in claim 9, further comprising:
  forming a second dielectric layer on the top electrode;
  forming a via plug in the second dielectric layer, wherein the via plug is electrically connected to the top electrode, and wherein the via plug and any one of the plurality of bottom electrodes are misaligned.

\* \* \* \* \*